United States Patent [19]

Reneau

[11] Patent Number: 4,535,256
[45] Date of Patent: Aug. 13, 1985

[54] INTEGRATED VIDEO AMP WITH COMMON BASE LATERAL PNP TRANSISTOR

[75] Inventor: Daniel L. Reneau, Elmhurst, Ill.

[73] Assignee: Zenith Electronics Corporation, Glenview, Ill.

[21] Appl. No.: 488,889

[22] Filed: Apr. 26, 1983

[51] Int. Cl.$^3$ ............................................. H03F 3/18
[52] U.S. Cl. .................................... 307/264; 307/494; 307/496; 330/255
[58] Field of Search ............... 307/491, 493, 494, 496, 307/500, 264, 270; 330/255, 311

[56] References Cited

U.S. PATENT DOCUMENTS

| | | | |
|---|---|---|---|
| 3,353,091 | 11/1967 | Matsumoto | 307/496 X |
| 3,908,170 | 9/1975 | Buhler | 330/255 X |
| 3,921,008 | 11/1975 | Claverie | 307/491 |
| 4,288,707 | 9/1981 | Katakura | 307/493 X |
| 4,406,990 | 9/1983 | Noro | 330/311 X |
| 4,446,443 | 5/1984 | Johnson et al. | 330/255 X |

OTHER PUBLICATIONS

Payne, "A High-Voltage High-Frequency Deflection Amplifier", Proceedings of the IREE, vol. 41, No. 2, Jun. 1980, pp. 68-70.

*Primary Examiner*—John S. Heyman
*Assistant Examiner*—D. R Hudspeth

[57] ABSTRACT

A PNP turnaround circuit includes a common base lateral PNP transistor connected to the output of a high gain amplifier having a resistor coupled thereacross. The input is supplied from a differential pair of NPN transistors havng their emitters connected to a current source. One transistor of the differential pair has its collector connected to the collector of the PNP for supplying a push/pull output. In another embodiment the collector of the PNP is returned to ground through a load resistor and a DC level shifted output signal is developed.

10 Claims, 4 Drawing Figures

INTEGRATED VIDEO AMP WITH COMMON BASE LATERAL PNP TRANSISTOR

BACKGROUND OF THE INVENTION AND PRIOR ART

This invention relates generally to signal translation systems for integrated circuits and specifically to enhanced PNP turnaround circuits therefor using common base connected lateral PNP transistors. The invention also broadly relates to common base connected lateral PNP transistors in integrated circuits for level shifting DC coupled signals. As is known, a lateral PNP is an integrated circuit transistor with the collector available for external connection.

Integrated circuit design has a number of recurrent problems, including the practical requirement for DC coupling between successive transistor stages, which limits the number of successive gain stages. This is due to the inability to fabricate suitably sized integrated circuit capacitors for low frequency signals, such as television video signals, for example. There is also a problem in obtaining single-ended push/pull output signals with good frequency response. This is due to the need to use PNP type transistors in common emitter configurations.

In integrated circuits, the differential mode of connection of transistors is used extensively because of the inherent similarity of the transistors produced during manufacture, which yields a very high degree of stability and predictability in the matched pairs.

It is well known that transistors operated in the common emitter mode exhibit good power gain, whereas those operated in the common base mode exhibit good voltage gain. It is also well known that a typical common emitter NPN transistor has a frequency response substantially greater than its common emitter PNP counterpart. For example, a typical NPN—3dB point is around 5 MHz whereas for a PNP it is around 300 KHZ. However, the usable frequency range for a common base connected PNP transistor is close to that of a common emitter connected NPN transistor.

The difficulty in obtaining push/pull outputs in integrated circuits is that the PNP frequency response is so poor in the common emitter configuration. It is known to use a common base lateral PNP connected in a so-called turnaround circuit having a PNP current mirror in one side of a differential amplifier to interface with the NPN stages. Unfortunately, the PNP current mirror is connected in common emitter fashion and limits the frequency response of the circuit.

The need to DC couple successive NPN stages results in the latter ones of the cascaded stages being operated at successively higher DC voltages. The operating voltage constraints on the integrated circuit chip impose practical limits, unless PNP stages or AC coupling is used. In television video circuits, where the video information includes 60 Hz vertical synchronizing signals as well as signals in the MHz range, external capacitors are needed. Thus, not only are extra "pin-outs" required on the IC but labor cost, size and reliability are all affected. Clearly, there is a need in integrated circuits for a PNP transistor arrangement for DC level shifting without sacrifice of frequency response.

OBJECTS OF THE INVENTION

A principal object of the invention is to provide improved signal translation means for an integrated circuit.

Another object of the invention is to provide a DC level shifting circuit suitable for integrated circuit use.

A further object of the invention is to provide a novel PNP transistor turnaround circuit.

SUMMARY OF THE INVENTION

In accordance with one aspect of the invention an integrated signal translation circuit is provided for DC coupling an input signal from an NPN transistor stage and developing a level shifted output without degradation of frequency response. It includes a high gain amplifier coupled to the NPN transistor for transforming input signal current to a voltage which is supplied to a lateral common base PNP transistor for developing the level shifted output.

In accordance with another aspect of the invention, a PNP turnaround circuit having good frequency response includes an input supplied from a current source, a common base lateral PNP transistor having its collector in series with the current source means, including a high gain amplifier transforming an input signal current to a voltage for application to the emitter of the PNP and means coupling the collector to an output circuit for developing push/pull current therein in response to signals applied to the input.

BRIEF DESCRIPTION OF THE DRAWINGS

Other objects and advantages of the invention will become apparent upon reading the following description in conjunction with the drawings in which.

DESCRIPTION OF THE PREFERRED EMBODIMENTS

Figure 1:
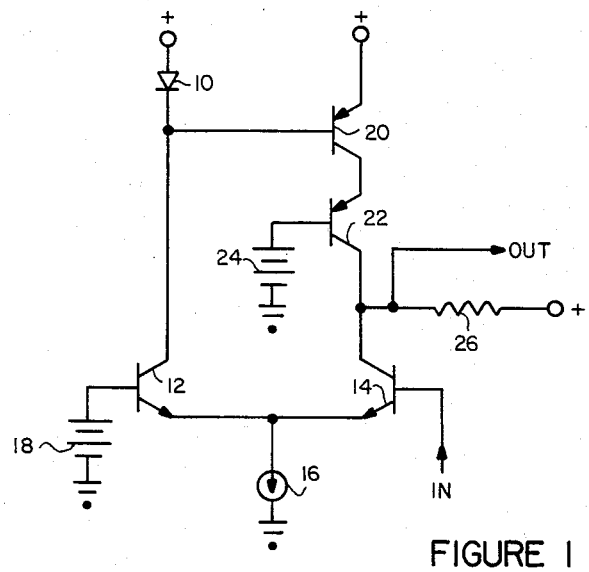
FIG. 1 is a schematic diagram of a PNP turnaround circuit of the prior art.

Referring to FIG. 1, a prior art PNP turnaround circuit is shown. A diode 10 is connected between a source of positive potential and the collector of an NPN transistor 12 which comprises one of a pair of transistors connected in a differential configuration. The other differentially coupled transistor is an NPN transistor 14 and the emitters of both transistors 12 and 14 are connected to ground through a current source 16. The base of transistor 12 is connected through a battery 18 to ground and the base of transistor 14 constitutes the circuit input. The cathode of diode 10 is also connected to the base of a PNP transistor 20 having its emitter connected to a positive potential source and its collector connected to the emitter of another PNP transistor 22, having its collector connected to the collector of transistor 14. The base of transistor 22 is connected, through a battery 24, to ground. The junction of the collectors of transistors 14 and 22 is connected to a source of positive voltage through a load resistor 26 and constitutes the circuit output.

Those skilled in the art will readily recognize this circuit as a conventional PNP turnaround using a PNP current mirror transistor 20 for supplying current to PNP transistor 22. While transistor 22 is operated in a common base mode and suffers little degradation in frequency response with respect to its corresponding common emitter NPN transistors, current mirror transistor 20 is operated in a common emitter mode and exhibits the restricted frequency response mentioned above. As a result, the circuit illustrated finds only limited application and is not useful for translating television video signals.

Figure 2:
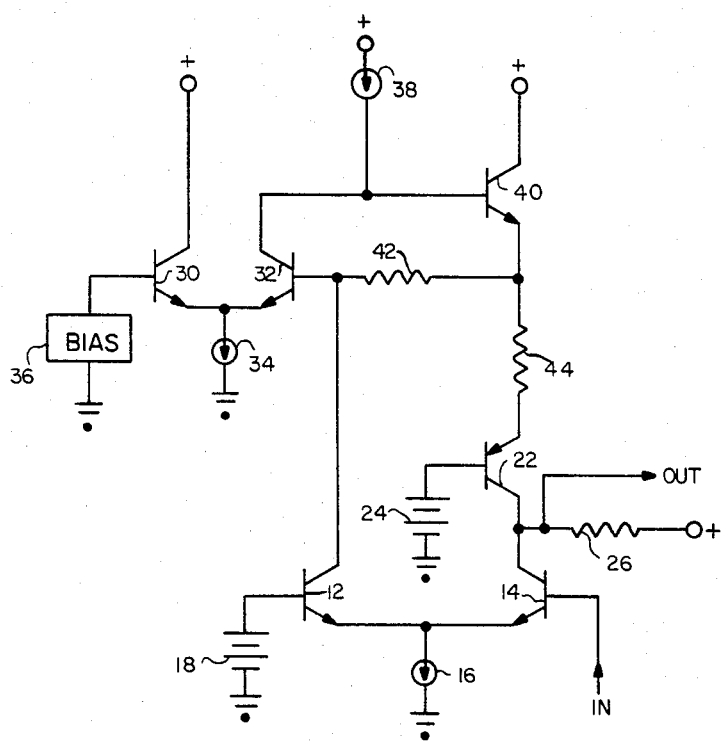
FIG. 2 is a schematic diagram of a PNP turnaround circuit constructed in accordance with the invention.

In FIG. 2, one aspect of the invention is illustrated where the common emitter PNP current mirror transistor 20 of FIG. 1 is eliminated to enhance the frequency response of the circuit. As those skilled in the art will observe, the circuit is also useful for shifting the DC level of the signal applied thereto. In this arrangement, the objective is a good frequency response push/pull output. The portion of the circuit of FIG. 2, including differentially coupled transistors 12 and 14, current source 16, bias source 18, PNP transistor 22, bias battery source 24 and load resistor 26, is the same as that of FIG. 1. In addition, a pair of differentially connected NPN transistors 30 and 32 have their emitters connected to ground through a current source 34. The base of transistor 30 is connected to ground through a bias source 36. The collector of transistor 30 is connected to a source of positive potential, whereas the collector of transistor 32 is connected to a current source 38. Another NPN transistor 40 has its collector connected to a positive potential, its base connected to current source 38, and its emitter connected to the junction of a pair of resistors 42 and 44. The other end of resistor 42 is connected to the base of transistor 32 and to the collector of transistor 12 and the other end of resistor 44 is connected to the emitter of transistor 22.

In this circuit arrangement, the base of transistor 32 and the emitter of transistor 40 represent the input and output respectively, of a high gain amplifier having a resistor 42 connected thereacross. Thus the voltage at the base of transistor 32 remains substantially constant. Therefore current in the collector of transistor 12 flows through resistor 42 and is reflected in a voltage change at the emitter of transistor 40. Since current change in transistor 12 "tracks" input current change in its differential pair transistor 14, the input signal current is transformed into a voltage at the emitter of transistor 40. Resistor 44 determines the current in the emitter-base input path of transistor 22, which is reflected in a change in its collector-base circuit. This current is supplied through load resistor 26, along with the current in the collector of transistor 14, in push/pull fashion. The input signal applied across the bases of the differentially coupled transistors 12 and 14 thus results in a single-ended push/pull output. Since the only PNP transistor in the circuit is connected in a common base configuration, the frequency limitations of common emitter connected PNP transistors are avoided and the circuit is useful for full frequency signals such as television video signals.

Figure 3:
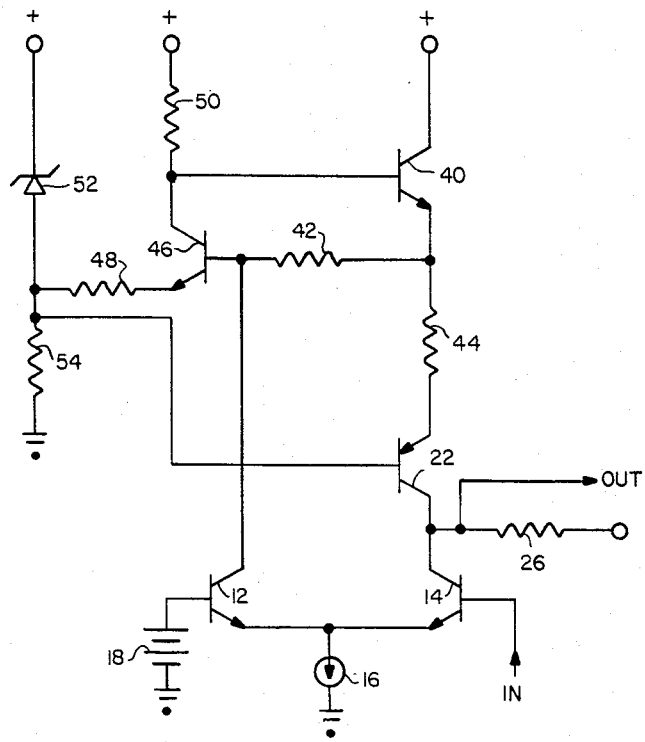
FIG. 3 is a simplified form of the turnaround circuit of FIG. 2.

In FIG. 3 a simplified form of the high gain amplifier of FIG. 2 is shown. An NPN transistor 46 has its base coupled to the junction of the collector of transistor 12 and resistor 42, its collector connected to a source of positive potential through a load resistor 50 and its emitter is biased through a resistor 48 connected to the junction of a zener diode 52 and a resistor 54. The zener diode and resistor 54 are connected between positive potential and ground and their junction is connected to the base of lateral PNP transistor 22. Thus, the base of transistor 46 is held at a substantially constant potential, provided the gain of the amplifier is sufficiently high, as is the base of transistor 22. Consequently the signal current in the collector of transistor 12 flows through resistor 42 resulting in a voltage transformation at the emitter of transistor 40 as described above for FIG. 2.

Figure 4:
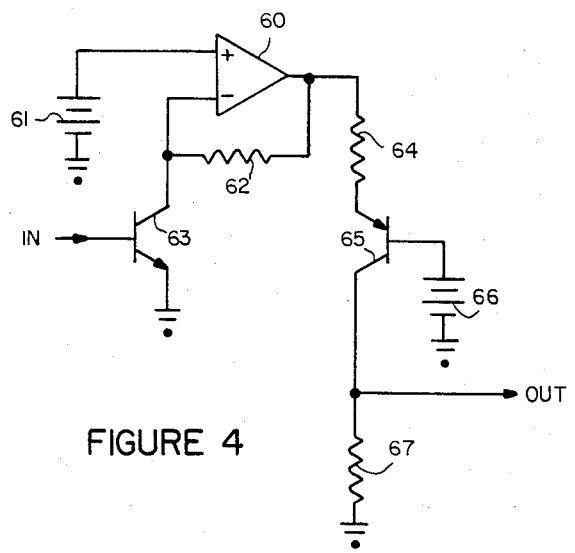
FIG. 4 represents a schematic diagram of a generalized version of the invention in a PNP level shifting arrangement.

FIG. 4 represents the generalized version of the circuit embracing the inventive concept. As mentioned above, the PNP transistor in the FIGS. 2 and 3 circuits shifts the DC level of the input signal—or at least enables shifting of the DC level, if desired. The generalized circuit of FIG. 4 illustrates this important aspect of the invention most clearly. A high gain operational amplifier 60 has its positive input connected through a bias battery 61 to ground. A resistor 62 connects its negative input with its output. Its negative input is also connected to the collector of an NPN transistor 63 having a grounded emitter and a base which serves as the circuit input. The output of operational amplifier 60 is connected through a resistor 64 to the emitter of a lateral PNP transistor 65 having its base returned to ground through a bias battery 66 and its collector returned to ground through a load resistor 67, across which the circuit output signal is taken. By adjustment of the value of resistor 67, it will be readily appreciated that the DC level of the output signal appearing across resistor 67 may be changed. Resistor 67 may be generally thought of as a current source. The amount of gain in the circuit is dependent upon the values of the resistors and the operating characteristics of the transistors.

In practice, the input signal to the level shifter would be the output of a cascaded string of NPN transistors and the output would supply another string of NPN transistors—all in an integrated circuit format. The arrangement enables signal amplification to levels which were heretofore unattainable without either increasing the level of voltage applied to the integrated circuit chip or using AC coupling. Because of the connection of the PNP transistor in a common base mode, the frequency response of the NPN common emitter connected transistors is preserved and the circuit should therefore find wide application in integrated circuit design.

What has been described in a novel arrangement using a lateral PNP transistor in a common base mode in an integrated circuit to retain frequency response and for effecting DC level shifting of signals from NPN stages in integrated circuits.

It is recognized that numerous modifications and changes in the described embodiments of the invention will be apparent to those skilled in the art without departing from the true spirit and scope thereof. The invention is to be limited only as defined in the claims.

What is claimed is:

1. In an integrated circuit, signal translation means for DC coupling an input signal from an NPN transistor to develop a level shifted output signal without degradation of frequency response, comprising:

a high gain amplifier, having an input terminal and an output terminal, being coupled to said NPN transistor at said input terminal for transforming input signal current therefrom to a voltage at said output terminal;

a lateral common base connected PNP transistor having an emitter and a collector; and means for supplying the emitter of said PNP transistor with said voltage for developing a level shifted output signal responsive thereto at said collector.

2. A circuit as set forth in claim 1 wherein a first resistor is coupled across said input terminal and said output terminal of said high gain amplifier for transforming said input signal current to said voltage.

3. A circuit as set forth in claim 2, further including a second resistor connected between the output terminal of said high gain amplifier and the emitter of said PNP transistor for determining emitter-base current flow in said PNP transistor.

4. A circuit as set forth in claim 3 further including a current source coupled to the collector of said PNP transistor, said collector supplying said level shifted output signal.

5. An integrated circuit including a lateral PNP signal translation system having good frequency response comprising:
   an input circuit;
   an output load impedance;
   a current source coupled to said input circuit;
   a common base PNP transistor having emitter, collector and base electrodes with its base-collector path in series with said current source;
   a high gain amplifier transforming signal current in said input circuit into signal voltage for the emitter-base path of said PNP transistor; and
   said base-collector path being in series with said output load impedance whereby push/pull currents are developed in said output load impedance responsive to signals applied to said input circuit.

6. A circuit as set forth in claim 5 wherein said input circuit and said current source comprise a differentially coupled pair of NPN transistors, with the collector of one of the NPN transistors in said differential pair being connected to the collector of said PNP transistor.

7. A circuit as set forth in claim 6 wherein said high gain amplifier includes input and output terminals with a resistor connected across said input and said output terminals and coupled between the collector of the other of said NPN transistors in said differential pair and the emitter of said PNP transistor.

8. A circuit as set forth in claim 7 further including another resistor connected between said amplifier output terminal and said emitter of said PNP transistor to control the current in said PNP transistor.

9. A circuit as set forth in claim 8 wherein said high gain amplifier comprises a pair of additional NPN transistors with said resistor coupling the emitter of one of said additional NPN transistors to the base of the other.

10. A PNP turnaround circuit for an integrated circuit arrangement of the type wherein there is provided a common base lateral PNP transistor coupled to a current source for developing push/pull current in a load responsive to input signals coupled to a common emitter PNP current mirror that is connected to the lateral PNP transistor, the improvement comprising:
   replacing said PNP current mirror with a high gain amplifier having an NPN transistor coupled to said lateral PNP transistor to thereby enhance the frequency response characteristic of said circuit.

* * * * *